United States Patent [19]

Friedrich et al.

[11] Patent Number: 5,340,946
[45] Date of Patent: Aug. 23, 1994

[54] HEAT ACTIVATABLE ADHESIVE FOR WIRE SCRIBED CIRCUITS

[75] Inventors: Marju L. Friedrich, Babylon; John G. Branigan, Smithtown; Maurice E. Fitzgibbon, Glen Cove, all of N.Y.

[73] Assignee: Advanced Interconnection Technology, Inc., Islip, N.Y.

[21] Appl. No.: 869,013

[22] Filed: Apr. 14, 1992

Related U.S. Application Data

[60] Division of Ser. No. 841,228, Feb. 21, 1992, which is a continuation of Ser. No. 335,139, Apr. 6, 1989, which is a division of Ser. No. 332,110, Apr. 3, 1989, Pat. No. Des. 319,508, which is a continuation of Ser. No. 75,351, Jul. 20, 1987, which is a continuation-in-part of Ser. No. 811,421, Dec. 20, 1985, abandoned.

[51] Int. Cl.$^5$ ............................................. H05K 1/00
[52] U.S. Cl. ..................... 174/256; 174/257; 174/258; 174/259
[58] Field of Search ............. 174/251, 256, 257, 258, 174/259

[56] References Cited

U.S. PATENT DOCUMENTS

| | | | |
|---|---|---|---|
| 3,475,200 | 10/1969 | Kallert et al. | 117/94 |
| 3,646,572 | 2/1972 | Burr | 174/68.5 |
| 3,674,602 | 7/1972 | Keogh et al. | 156/380 |
| 3,674,914 | 7/1972 | Burr | 174/68.5 |
| 4,029,626 | 6/1977 | Gillemot et al. | 260/31.6 |
| 4,068,086 | 1/1978 | Dalibor | 560/169 |
| 4,093,675 | 6/1978 | Schure et al. | 260/835 |
| 4,097,684 | 6/1978 | Burr | 174/68.5 |
| 4,116,937 | 9/1978 | Jones et al. | 528/170 |
| 4,137,364 | 1/1979 | Ball, III et al. | 428/412 |
| 4,194,618 | 3/1980 | Malloy | 206/205 |
| 4,251,427 | 2/1981 | Recker et al. | 260/37 N |
| 4,251,428 | 2/1981 | Recker et al. | 260/37 N |
| 4,427,478 | 1/1984 | Grant et al. | 156/275.5 |
| 4,430,479 | 2/1984 | Merton et al. | 525/127 |
| 4,476,259 | 10/1984 | Kordomenos | 523/400 |
| 4,588,788 | 5/1986 | Emmons et al. | 525/531 |
| 4,642,321 | 2/1987 | Schoenberg et al. | 174/251 |

FOREIGN PATENT DOCUMENTS

| | | |
|---|---|---|
| 97815 | of 1984 | European Pat. Off. |
| 1237936 | of 0000 | France |
| 1504252 | of 0000 | United Kingdom |

Primary Examiner—Leo P. Picard
Assistant Examiner—Cheryl R. Figlin

[57] ABSTRACT

A non-tacky, solid, adhesive composition comprising: (a) at least one film forming polymeric resin of number average molecular weight (Mn) of at least about 10,000 and having a hydroxyl, epoxide or unsaturated functionality greater than about 7, the polymeric resin being selected from the group of polyols consisting of polyesters, polyurethanes, phenoxies, epoxies and mixtures thereof; a plasticizer present in an amount which permits the activation without C-staging of the polymeric resin; (b) a curing agent which is capable of crosslinking and curing the polymeric resin to a C-stage, the curing agent being present in an amount sufficient to C-stage the polymeric resin. The adhesive composition can be activated without C-staging the polymeric resin, upon application of sufficient heat or ultrasonic energy for a time period less than one second. The curing agent is non-reactive at the conditions which will activate the adhesive composition, but can be made reactive upon application of sufficient energy in the form of radiant energy or in the form of heat above the activation temperature, for a time period sufficient to cure the polymeric resin in the composition. The adhesive composition is capable of converting, in the C-stage, into an infusible composition which does not melt, flow or decompose when exposed for 10 seconds to molten solder at 260° C. and does not soften when exposed to dichloroethane at 25° C. for 10 seconds. The adhesive composition is suitable for forming a wire scribed circuit board and embedding a wire conductor on a surface of the circuit board.

1 Claim, No Drawings

HEAT ACTIVATABLE ADHESIVE FOR WIRE SCRIBED CIRCUITS

This is a divisional of co-pending application Ser. No. 07/841,228 filed Feb. 21, 1992 which in turn is a file wrapper continuation of Ser. No. 07/335,139 filed Apr. 6, 1989. Ser. No. 07/335,139 is a divisional of application Ser. No. 07/332,110 filed Mar. 13, 1989, which is a file wrapper continuation of application Ser. No. 07/075,351 filed Jul. 20, 1987, which in turn is a continuation-in-part of application Ser. No. 06/811,421 filed Dec. 20, 1985, abandoned.

BACKGROUND OF THE INVENTION

1. Field of the Invention

This invention relates to a polymeric resin containing adhesive coating composition which can be heat activated without C-staging of the polymeric resin and later the polymeric resin can be C-staged, a wire scribed circuit board using said adhesive composition for embedding a wire conductor, and a process for forming the wire scribed circuit board.

2. Description of Prior Art

Heat activatable adhesive compositions can be applied to a substrate as a thin, non-tacky film, can be heat activated and when activated, become and remain tacky for a period of time after activation. Most heat activated thermoplastic adhesives resolidify rapidly upon cooling and have a short open time, i.e., after activation, the adhesive remains aggressively tacky and bondable below the activation temperature for only a short time. Bonding operations must be carried out quickly.

In many bonding operations, it is necessary to employ adhesive compositions which result in adhesive bonds exhibiting resistance to degradation at elevated temperatures. It is known that improved temperature resistance of adhesive compositions can be achieved by the incorporation of crosslinking components into the compositions. Particular crosslinking components known in the art include the polyepoxides and optional epoxy polymerization catalysts described in U.S. Pat. No. 3,723,568 to Hoeschele wherein crosslinking is achieved by reactions with available sites in the base polymers.

U.S. Pat. No. 4,137,364 to Ball etal. describes crosslinking of an ethylene/vinyl acetate/vinyl alcohol terpolymer using isophthaloyol biscaprolactam or vinyl triethoxy silane. Crosslinking is achieved before heat reactivation. A higher level of performance is attained by additional crosslinking induced by a heat cure after application of the adhesive. Another example of thermal crosslinking compositions is the polyamino his maleimide class of flexible polyimides described in U.S. Pat. No. 4,166,937 to Jones et el. These compositions can be hot melt extruded up to 300° F. and undergo crosslinking at temperatures above 300° F. In both of these examples, thermal crosslinking is achieved by reactions of the particular crosslinking agent with available sites of the base polymers.

Thermosetting adhesive compositions are known which combine polyisocyanates with binders containing groups that are reactive toward isocyanate groups. However, considerable difficulties result from the fact that the isocyanate groups react with the envisaged reactant, e.g., a polyol or a polyamine, at as low as room temperature. As a result, At is extremely difficult to formulate a combination having a long shelf life.

In order to overcome this difficulty, two-component systems are frequently used. The reactants are stored in separate formulations, which are mixed only just before application; the reaction then takes place spontaneously or is accelerated by heat and/or a catalyst.

For example, such a two-component system is described in U.S. Pat. No. 4,029,626. Disadvantages of this system are the necessity for separate formulation and storage of the two components, the difficulties in precise metering and thorough mixing before application, and the danger of blockage of the mixing apparatus and applicator as a result of premature reactions.

Another conventional method of preparing polyisocyanate materials having a long shelf life starts from non-crosslinked prepolymers which contain only a small amount of free isocyanate, atmospheric moisture serving as the crosslinking agent. This method is described in, for example, French Patent No. 1,237,936. The disadvantages in this case is that the hardening, which begins at the surface, extends only very slowly to the deeper regions of the coating, so that the final properties are acquired only after weeks or months. No hardening at all occurs between large areas or in cavities.

Stable systems also can be formulated if the polyisocyanate is first reacted with a monofunctional reactant. The resulting adduct is referred to as a blocked isocyanate if it is less heat-stable than the product of the crosslinking reaction to be carried out subsequently. Under the action of heat, the blocking agent is eliminated, and the polyisocyanate undergoes crosslinking, forming more heat stable bonds.

The principle is described in, for example, Frisch, "Fundamental Chemistry and Catalysis of Polyurethanes", *Polyurethane Technology*, Bruins, editor (Interscience Publishers, New York, 1969), pp. 11-13; and U.S. Pat. Nos. 4,068,086 and 4,251,428.

Because of the eliminated blocking agent, such formulations have technical and economic disadvantages: if the blocking agent remains in the crosslinked material, it changes the properties of the latter; if it vaporizes, it either has to be recovered or has to be removed from waste air.

U.S. Pat. Nos. 3,475,200; 4,251,427; and 4,251,428 describe polyisocyanates which melt at above 100° C. and at above 130° C., respectively, and which, with special polyols, give combinations which have long shelf lives and which can be hardened by heating to give coatings for fabrics or woven hoses.

The industrial disadvantages of the combinations described in these publications is that products having a long shelf life can be obtained only with a very small number of polyols having a special composition. Therefore, these combinations are, for example, completely suitable for a limited number of uses.

U.S. Pat. No. 4,093,675 to Schure et al. describes an adhesion composition containing a poly(ester/ether) block copolymer (I) with terminal OH, which is chain extended and carboxylated with a dianhydride, to form a carboxylated poly(ester/ether), a block copolymer having the formula:

wherein —O—O— is a poly(ester/ether) block copolymer; R is alkyl, cycloalkyl or aryl; and n is 1 to 2. The thermoplastic block copolymer may be hardened to a thermosetting copolymer which contains a cross-linked component as well as s linear, flexible copolymer component. The crosslinked copolymer is a block copolymer in which one of the blocks itself is a block copolymer, and can resist creep at 150° C.

U.S. Pat. No. 4,430,479 to Merton etal. describes an adhesive composition which comprises a thermoplastic polymer (I); 1-100 parts by weight of a crosslinkable polymer (II) being a hydroxy-substituted polyester of polyacrylate or a polyamine; and a crosslinking agent, preferably a di- or polyisocyanate. (I) is preferably a polyester, polyurethane, polyamide, rubber or ethylene/vinyl acetate polymer, and optionally contains up to 100 parts by weight per 100 parts by weight of conventional tackifying resin (typically hydrogenated and dehydrogenated resin esters). The compositions have good adhesive strength; they exhibit delayed tack on heat activation, which is achieved at relatively low temperature, and show high temperature resistance. They are non-blocking and may be applied to substrates well in advance (about 60 days) of the actual bonding operation.

U.S. Pat. No. 4,194,618 to Norton describes a coated abrasive article comprising a backing member having abrasive grains adhered thereto. The article has two of its ends Joined together by a layer of an adhesive composition, which in its initial state is a preformed adhesive film which has been partially cured but which can still be activated at a temperature suitable for splicing the ends together. The adhesive film is the reaction product of an adhesive composition comprising a mixture of (a) a hydroxy-terminated polyurethane-polyester of hydroxyl No. 2-15; (b) an active hydrogen component having an active hydrogen equivalent weight of 27 to 500; (c) a component having free available isocyanate groups; and (d) a chlorinated aliphatic hydrocarbon, chlorinated aromatic hydrocarbon and/or alkylated polystyrene, this component being miscible with components (a), (b) and (c).

U.S. Pat. No. 4,476,259 to Kordomenos describes a solvent based thermosetting composition comprising: a hydroxy functional epoxy ester resin having a number average molecular weight (Mw) between 1,000 and about 5,000; and (b) a polyfunctional, hydroxy-reactive, crosslinking agent. The epoxy ester resin is formed by the reaction of diepoxide, which has been chain extended with diphenol and dicarboxylic acid, with a hydroxyfunctional, secondary amine in a chain terminating reaction, in about a 1:1 equivalent ratio. The crosslinking agent is an amino crosslinker or a blocked isocyanate crosslinking agent comprising isocyanate groups blocked by reaction with an active hydrogen bearing blocking agent.

U.S. Pat. Nos. 3,646,572 and 4,097,684 to Burr describe a catalytic adhesive for wire scribed circuit boards which comprises a flexible adhesive resin, alone or in combination with thermosetting resins. The flexible adhesive resins include epoxy resins, polyvinyl acetal resins, polyvinyl alcohol, polyinyl acetate, natural and synthetic rubbers and acrylic polymers and copolymers. Preferred for use as the adhesive resin are natural and synthetic rubbers such as chlorinated rubber, butadiene-acrylonitrile copolymers, and acrylic polymers and copolymers.

The use of this adhesive in a process for manufacturing wire interconnection boards is mentioned in U.S. Pat. Nos. 3,674,602 to Keogh et al and 3,674,914 to Burr. The adhesive layer is in the form of a partially cured theromsetting resin which is non-tacky at room temperature, but which, upon application of heat below the thermosetting temperature, becomes malleable and provides an adhesive bond when heated momentarily and cooled. In a step of the aforementioned process, after the wire conductor pattern is completed it is permanently bonded to the substrate by pressing the wire conductors into the adhesive layer with heat and pressure further curing the adhesive, or, by covering the wire conductors with a glass cloth reinforced, epoxy prepeg and then laminating the wire conductors into the adhesive with heat and pressure. Adhesive based upon those described in the aforementioned Burr patents have been used commercially in the manufacture of wire scribed circuit boards for many years.

In the aforementioned laminating step, occasionally, wire-conductors laid down in the correct position would "swim" away when a cover layer of epoxy impregnated fiberglass was laminated over the wire conductors under heat and pressure. The hydraulic pressure of the melted epoxy resin, and partially melted adhesive layer beneath, moved the wire conductors. Attempts to eliminate the aforementioned wire swimming, by increasing the partial cure of the adhesive before wiring, or by baking after the wire conductor pattern had been completed, or by modifying the laminating conditions were not successful.

The volume resistivity of adhesive layers of the type described by Burr is about $1 \times 10^4$ to $1 \times 10^6$ Megohm-cm because high rubber content is needed to give tack for ultrasonic or heat bonding of the wire to the adhesive. In some applications requiring high insulation resistance, higher volume resistivity is preferred.

U.S. Pat. No. 4,427,478 to Grant et al. describes the use of a photochemically curable adhesive for encapsulating wires on a wire scribed circuit board. The adhesive is a mixture of acrylate esters of epoxy novolac resins and bisphenol A epoxy resins. The adhesive is deposited on a substrate and after wire are laid therein, the adhesive is partially light cured in an attempt to prevent wire swimming, and later is photochemically or thermally cured fully to rigidly fix the wire on the substrate.

European Patent Application No. 97815 of 1984 describes a photocurable adhesive for holding wires in a circuit board, the adhesive comprising a bisphenol A based epoxy resin of molecular weight 1500-5000, an epoxidized novolac of molecular weight 900-1500, a monoethylenically unsaturated carboxylic acid, a catalyst, a polyethylencially unsaturated compound, a photoinitiator, a phenoxy resin with a molecular weight above 30,000, and a thixotropic agent.

U.K. Patent Specification No. 1,504,252 by Nicolas suggests wire scribing using a thermosetting adhesive layer which is deposited over a substrate except for surfaces thereof where solder connections are subsequently to be made. Nicolas does not describe any suitable or preferred adhesive compositions.

SUMMARY OF THE INVENTION

1. Objects of the Invention

It is an object of this invention to provide a polymeric resin containing adhesive coating composition which is activatable upon application of sufficient heat or ultrasonic energy without C-staging the polymeric resin and later the polymeric resin can be C-staged.

It is an object of this invention to provide polymeric resin containing adhesive coating composition which can be coated onto or applied to wires and which can be activated upon application of sufficient heat or ultrasonic energy without C-staging the polymeric resin and later the polymeric resin can be C-staged.

An object of this invention is to provide an adhesive coating composition which is suitable for bonding a wire to a surface.

It also is an object of this invention to provide an adhesive coating composition for wire scribed circuits with a volume resistivity over the temperature range of 20° C. to 120° C. which is at least an order of magnitude, and preferably at least 2 orders of magnitude, greater than the volume resistivity of adhesive compositions of the type described in the aforementioned Burr patents.

An object of this invention is to provide a solid, adhesive composition containing a polymeric resin which can be C-staged prior to an encapsulation step to substantially eliminate wire swimming in subsequent processing steps.

Another object of this invention is to provide a solid, adhesive composition which is non-tacky at room temperature and is ultrasonically or heat activatable.

An object of this invention is to provide an adhesive composition which may contain up to 25% volatiles for facile ultrasonic activation, and also remains non-tacky in the absence of heat and pressure.

It is an object of this invention to provide an adhesive coating composition for wire scribed interconnection boards containing little or no natural or synthetic elastomers or rubbers.

It is further object of this invention to provide a substrate with an adhesive coating thereon for preparation of wire scribed circuit boards.

An object of this invention is to provide a thermosetting adhesive coating composition which can behave like a hot melt adhesive, i.e., it flows and becomes tacky when heated to or above its melting range, and thereafter rapidly resolidifies when cooled to below said melting range, and which also can be thermoset by ultraviolet radiation.

An object of this invention is to provide an adhesive coating composition which can adhere a 0.1 mm diameter wire to an insulating substrate with a bond strength greater than 30 grams, preferably greater than 40 grams.

A further object of this invention is to provide a wire scribed circuit board having an insulation resistance of at least $1 \times 10^5$ megohms.

2. Definitions

Unless otherwise defined herein, the terms used in this application are defined as set for in the American Society for Testing and Materials Standard D907-82.

By heat activatable adhesive is meant a dry adhesive film that can be rendered tacky or fluid by application of heat, heat and pressure, or ultrasonic energy.

By B-stage is meant an intermediate stage in the reaction of certain thermosetting resins in which the material softens when heated and swells when in contact with certain liquids, but may not entirely fuse or dissolve. The resin in an uncured thermosetting adhesive, is usually in this stage.

By blocked curing agent is meant a curing agent or hardener which has been rendered unreactive and can be reactivated as desired by physical or chemical means.

By bond strength is meant the unit load applied in tension, compression, flexure, peel, impact, cleavage, or shear, required to break an adhesive assembly with failure occuring in or near the plant of the bond.

By C-stage is meant the final stage in the reaction of certain thermosetting resins in which the material is relatively insoluble and infusible. Certain thermosetting resins in a fully cured adhesive layer are in this stage.

By doctor-roll is meant a roller mechanism that is revolving at a different surface speed, or in an opposite direction to that of a spreader roll, thus, resulting in a wiping action for regulating the adhesive supplied to the spreader roll.

By filler is meant a relatively non-adhesive substance added to an adhesive to improve its working properties, permanence, strength, or other qualities.

By plasticizer is meant a material incorporated in an adhesive to increase its flexibility, workability, or distensibility.

By tack is meant the property of an adhesive that enables it to form a bond of measurable strength immediately after adhesive and adherend are brought into contact under low pressure.

By thermoplastic is meant a material that will repeatably soften when heated and harden when cooled.

By thermoset is meant a material that will undergo or has undergone a chemical reaction by the action of heat, catalysts, ultraviolet light, etc., leading to a relatively infusible state.

By $T_g$, is meant the glass transition temperature, the temperature at which an amorphous high polymer changes from a brittle vitreous state to a plastic state.

By onset of $T_g$, is meant the beginning of a glass transition in a blend of polymers in an adhesive as measured by differential scanning calorimetry or thermal mechanical analysis.

By wire scribing is meant affixing a wire to an insulating base to form an interconnection pattern.

3. Brief Summary of the Invention

Briefly, this invention relates to a non-tacky, solid, polymeric resin containing adhesive composition which can be activated without C-staging of the polymeric resin upon application of sufficient heat or ultrasonic energy for a time period of less than 1 second which comprises;

a) a first component comprised of a film forming polymeric resin having a number average molecular weight (Mn) of at least about 10,000 and a hydroxyl, epoxide or unsaturated functionality greater than about 7, said polymeric resin being selected from the group of polyols consisting of polyesters, polyurethanes, phenoxies, epoxies and mixtures thereof;

b) a second component comprised of a plasticizer present in an amount which permits the activation without C-staging of the composition; and c) a curing agent which is capable of reacting or initiating a reaction with the functional groups of the polymeric resin to form crosslinks and cure the polymeric resin to a C-stage upon application of sufficient energy in the form of radiant energy or in the form of heat at a temperature above the activation temperature of the composition for a time period sufficient to cure the polymeric resin, said curing agent being non-reactive or blocked when the adhesive composition is activated, said curing agent being present in an amount sufficient to C-stage the polymeric resin; said composition capable of converting in the C-stage into an infusible composition which does not melt or flow when exposed to a temperature up to about 200° C. and a pressure up to 3 MPa, in a plane perpendicular to the direction of the applied pressure.

This invention further relates to an improvement in a process for forming a wire scribed circuit wherein at least one adhesive layer is applied onto a substrate and at least one wire conductor is scribed onto the adhesive layer and in a subsequent step, the adhesive layer is C-staged, the improvement which comprises:

(a) using as the adhesive layer a non-tacky, solid polymeric resin containing adhesive composition which can be activated, without C-staging the polymeric resin, upon application of sufficient heat or ultrasonic energy for a time period less than 1 second and which comprises;

(1) a first component comprised of a film forming polymeric resin having a number average molecular weight (Mn) greater than about 10,000 and a hydroxyl, epoxide or unsaturated functionality greater than about 7, said polymeric resin being selected from the group of polyols consisting of polyesters, polyurethanes, phenoxies, epoxies and mixtures thereof;

(2) a second component comprised of a plasticizer selected from the group consisting of an organic solvent, a reactive diluent, or mixtures thereof with an aromatic petroleum oil, the plasticizer being present in an amount which, upon activation of the composition without C-staging the polymeric resin, permits formation of a bond between the adhesive film layer and the wire conductor, and permits the wire conductor to be fixedly secured in the X and Y direction within the film; and (3) a curing agent which is capable of reacting or initiating a reaction with the functional groups of the polymeric resin to form crosslinks and cure the polymeric resin to a C-stage upon application of sufficient energy in the form of radiant energy or in the form of heat at a temperature above the activation temperature of the composition for a time period sufficient to cure the polymeric resin, said curing agent being non-reactive or blocked at the conditions required to activate the adhesive layer, said curing agent being present in an amount sufficient to C-stage the polymeric resin; and (b) evaporating substantially all the solvent plasticizer or reacting substantially all of the diluent plasticizer prior to completion of the C-staging step.

This invention also relates to a wire scribed circuit board having at least one C-staged adhesive layer on a substrate and wire conductors scribed into the adhesive layer, said adhesive layer formed from a composition comprised of a film forming polymeric resin having a number average molecular weight (Mn) greater than about 10,000 and a hydroxyl, epoxide or unsaturated functionality greater than about 7, said polymeric resin being selected form the group consisting of polyesters, polyurethanes, phenoxies, epoxies and mixtures thereof. The board preferably has an Insulation resistance, measured in accordance with MIL-STD-202, of at least $1 \times 10^5$ megohms.

4. Detailed Description of the Invention

The film forming polymeric resins useful in the present invention should have a molecular weight sufficiently high to be good film formers, and should be non-tacky when dry. Suitable film forming polymeric resins useful in the adhesive compositions of the present invention include those polyols having a hydroxyl, epoxide or unsaturated functionality greater than about 7, preferably greater than about 20 and are selected from polyesters, epoxies, polyurethanes, and phenoxy resins and mixtures thereof. The functionality is available for crosslinking with a curing agent to C-stage the polymeric resin in the adhesive composition. Examples of unsaturated functional groups include: vinyl, allylic, methallylic, acrylic and methacrylic groups.

In one emodiment, the functional groups of the film forming polymeric resin are hydroxyl and the curing agent is a blocked polyisocyanate. In another embodiment, the functional groups of the film forming polymeric resin are unsaturated double bonds such as acrylic and allylic groups, and the curing agent is a free radical initiator.

It has been found that phenoxy resins such as poly (4,4'-isopropylidenediphenol-1,3-glyceryl ether) having the recurring structural unit:

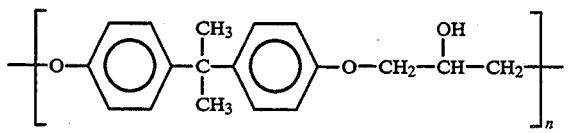

where n is an integer from 20 to 350, are particularly useful in the adhesive compositions of the present invention. Such phenoxy resins are linear and may have one or two terminal oxirane groups. Phenoxies are properly regarded as thermoplastic materials.

Suitable polyesters are believed to include those prepared from (1) one or more diacids selected from saturated and unsaturated aliphatic dicarboxylic acids such as terephthalic acid, isophthalic acid, phthalic acid, 4,4'-diphenythioether dicarboxylic acid, 4,4'-diphenylamine dicarboxylic acid, and saturated and unsaturated aliphatic dimer acids (i.e., the polymerized product of two molecules of an unsaturated fatty acid containing 12 to 26 carbon atoms) and mixtures and derivatives thereof; and (2) one or more saturated or unsaturated aliphatic diols containing from 2 to12 carbon atoms, long chain aliphatic diols having an average molecular weight of 200 to 4,000, polyethylene oxide and polypropylene oxide polymers and copolymers, and allyl ethers of polyethylene and polypropylene oxide, and polyhydroxyl compounds such as glycerin, trimethylolpropane and neopentyl alocohol and mixtures and derivatives thereof.

Suitable epoxy resins are believed to include diglycidylethers of bisphenol A having epoxy equivalent weights of 400 to 6,000, diglycidylethers of halogenated bisphenol A having epoxy equivalent weights of 450 to 2,000, epoxy novolacs or polyglycidyl ethers of phenol-formaldehyde, polyglycidyl ethers of tetrapheylethane and polyglycidylethers of resorcinol. Also believed to be suitable are very high molecular weight copolymers of bisphenol A and epichlorhydrin with weight average molecular weights greater than about 50,000 and number average molecular weights greater than 10,000 and preferably greater than 15,000. Preferred epoxy resins are diglycidylethers of bisphenol A having epoxy equivalent weights of 1,000 to about 6,000.

Suitable polyurethanes are believed to include the reaction products of diisocyanates and polyesters, polyethers or polyester/polyether copolymers. Preferred polyurethanes are those containing aliphatic linkages of 100 to 1,000 daltons and some aromatic groups (e.g., isophthalate or terphthalate ester groups or toluene diurethane groups).

Suitable film forming polymeric resins according to this invention may be obtained by using one or more polyols intrinsically having a number average molecular weight greater than about 10,000, preferably greater than about 15,000 or by reacting a low molecular weight polyol selected from the group of polyols consisting of polyesters, polyurethanes, polyethers, epoxies, and combinations thereof to a B-stage with a curing agent which is present either in less than a stoichiometric quantity or is capable of reacting with functional groups that were present at low concentrations on the polymer chain so that the B-staged polymeric resin has the aforementioned high number average molecular weight. Preferably, the curing agent used for B-staging the low molecular weight polyol is an isocyanate or an amide.

The film forming polymeric resins of this invention provide adhesion, chemical and thermal resistance and flexibility for the adhesive composition. Adhesion to a variety of surfaces is enhanced by polar groups along the polymer chain. Hydroxyl groups on the backbone of a phenoxy resin are one example of suitable polar groups. Flexibility of the adhesive composition is provided by internal plasticization of aliphatic portions of the polymeric resin. Thermal resistance of the adhesive composition is enhanced by the presence of aromatic groups in a repeating pattern along the polymer backbone. Chemical resistance of the adhesive composition is enhanced by the presence of the aromatic groups as well as ether linkages in a repeating pattern on the polymer backbone. The ether linkages are stable in alkalis and in inorganic acids.

Plasticizers suitable for this invention are selected so that they do not degrade the properties of the C-staged adhesive composition. Prior to C-staging, the plasticizer should be compatible with the polymeric resin, i.e., it doesn't separate from the adhesive composition. The plasticizer should soften the adhesive composition and adjust the softening point or the onset of $T_g$ of the adhesive to a range suitable for heat or ultrasonic activation, i.e., the onset of $T_g$ is preferably adjusted to between about $-5°$ C. and about $+15°$ C., preferably between about 4° C. and about 10° C.

One group of plasticizers are volatile and can be vaporized prior to C-staging and subsequent to formation of a bond between the adhesive composition and a wire conductor. Suitable volatile plasticizers are solvents for the polymeric resins. Suitable organic solvents are those having boiling points above about 100° C., preferably above about 120° C. and include glycol ethers such as ethers of ethylene glycol or propylene glycol with aliphatic groups having 1 to 4 carbon atoms; glycol ether esters such as acetates of methyl, ethyl and propyl ethylene glycol ethers; ketones having from 6 to 9 carbon atoms such as methylbutyl ketone, methyl isoamyl ketone, ethyl amyl ketone, methyl heptyl ketone, n-methyl-pyrollidone and cyclohexanone; aromatic hydrocarbons such as xylene and toluene; and substituted aromatic hydrocarbons such as cresol.

A second group of plasticizers are reactive diluents and can be crosslinked with the polymeric resin and thereby form part of the C-staged composition. Suitable reactive diluent plasticizers include acrylate and methacrylate esters having boiling points above 100° C., and low molecular weight mono- or diepoxide compounds such as neopentyl diglycidyl ether, butyl glycidyl ether and the like.

A third group of plasticizers which are used in combination with one or both of the first two groups of plasticizers are high boiling oils which do not volatilize or exude from the adhesive composition below 160° C., preferably below 300° C. Suitable high boiling oils are believed to include aromatic oils, e.g., an aromatic petroleum oil having a boiling point above 315° C. and believed to consist of 96.2% aromatic oil and 3.8% paraffinic oil (commercially available from Kenrich Petrochemicals, Inc., Bayonne, N.J. as Kenplast G ™ ).

It has now been found possible, by controlling the amount and type of crosslinking introduced into a C-stageable adhesive coating composition to render said composition heat activatable until the polymeric resin in said composition is C-staged. Thus, until the polymeric resin in the adhesive coating composition of the present invention is C-staged, the composition can be rendered tacky upon application of sufficient heat or ultrasonic energy and will rapidly resolidify upon cooling, i.e., upon dissipation of said energy. The polymeric resin in the resolidified adhesive coating composition can be C-staged which will increase the temperature resistance of the composition without altering other desirable properties, i.e., the dimensional stability and adhesive strength of the composition. In preferred compositions, for example, crosslinking is achieved at a temperature higher than that required for heat activation through use of a polyol as defined above having a hydroxy, epoxide or unsaturated functionality greater than about 20 and a blocked isocyanate crosslinking agent capable of reacting with the polyol, or an ultraviolet curing agent capable of initiating crosslinking with functional groups of the polyol.

In some wire scribed circuit board applications, it is desirable after scribing to pressure laminate or flush press the wires down into the adhesive layer. This pressure lamination provides a planar surface which is preferable when copper foil is to be laminated over the wire scribed pattern. Flush pressing permits formation of a level copper surface which is suitable for photolithographic production of surface mounting pads and other etched surface conductor features.

When the adhesive layer and the wire scribed pattern are applied over a voltage reference plane, the impedence of the wire scribed conductors may be controlled by the distance between the scribed conductors and the reference plane. In these controlled impedance applications, it also is preferred to pressure laminate or flush press the wires into the adhesive to provide a more uniform spacing between the voltage reference plane and the scribed wire conductors, and to eliminate voids or air gaps under the wires especially where wires cross over one another.

To obtain maximum thermal, chemical and electrical resistance in the adhesive layer, the resins in the adhesive layer are cured to a highly crosslinked, C-staged state. When the adhesive is cured to a highly crosslinked, C-stage it is too hard and thermally resistant to permit flush pressing of the scribed wire conductive pattern. When flush pressing wire scribed conductors, it is preferred to use two blocked curing agents for the adhesive. The first curing agent is used in a low concentration and establishes enough crosslinks in the adhesive to prevent wire "swimming" during the flush pressing step. The second curing agent is present in an amount sufficient to form the highly crosslinked, C-stage state.

The first curing agent is unblocked at conditions which will not unblock the second curing agent, e.g., the first curing agent unblocks at a lower temperature than the second curing agent. Thus, after wire scribing the conductive pattern, the adhesive is heated to a temperature that unblocks only the first curing agent, and the adhesive is partially cured to prevent wire "swimming"; the wire conductive pattern is flush pressed and then the adhesive layer is heated to a temperature that unblocks the second curing agent.

The selection of the curing agent to crosslink the functional groups and cure the polymeric resin in the adhesive composition to a C-stage will depend on the functional groups available. If the functional groups are hydroxyl, the curing agent may be selected from polyisocyanates, urea-melamine resins, phenols and compounds containing phenolic hydroxyl groups. Among the polyisocyanates are blocked polyisocyanates which unblock at temperatures above 75° C., preferably above 100° C. Suitable blocked polyisocyanate curing agents are believed to include those described by U.S. Pat. No. 4,476,259 to Kordomenos, incorporated herein by reference.

If the functional groups available in the B-staged adhesive composition are epoxide, the curing agent is selected from latent epoxy curing agents such as dicyandiamide and the boron trifluoride-monoethylamine complex. Other latent curing agent systems believed to be suitable include anhydride curing agents with latent catalysts. Anhydride curing agents include dodecenyl succinic anhydride, chlorendic anhydride, hexahydrophthalic anhydride, NADIC methyl anhydride, phthalic anhydride, succinic anhydride and tetrahydrophthalic anhydride. Latent catalysts for use with anhydride curing agents include boron trifluoride-monoethylamine complex, quaternary ammonium halides such as benzyltrimethylammonium chloride, stannous octoate, zinc stearate, extra-coordinate siliconate salts, triethanolamine borate, triethanolamine titanate and quaternary phosphonium compounds such as methyltrioctyl-phosphonium dimethylphosphate, tetrabutylphosphonium acetate, methyltributylphosphonium dimethylphosphate, benzyltriphenylphosphonium chloride, tetrabutylphosphonium chloride, methyltriphenylphosphonium dimethyl phosphate and triphenylethylphosphonium iodide. Also suitable for cross linking epoxy groups are blocked Lewis acid catalysts which can be unblocked by ultraviolet radiation. The blocked Lewis acid catalysts include aromatic iodonium complex salts (see, for example, U.S. Pat. Nos. 3,565,906; 3,712,920; 3,759,989; and 3,763,187) and aromatic sulfonium complex salts, e.g., triphenylsulfonium hexa fluorantimonate and triphenylsulfonium hexafluorophosphate.

If the functional groups available for curing the polymeric resin in the adhesive composition to a C-staged are unsaturated carbon-carbon double bonds, a free radical initiator is used as curing agent. Suitable free radical initiators which are activated by heat include 1,1'-azobis(cyclohexane carbonitrile), dicumyl peroxide, 1,1'-bis(ter-butylperoxy)-diisopropylbenzene and the like. Suitable free radical photoinitiators include benzoin, benzoin alkyl ethers, benzol ketals, dialkoxyacetophenones, di- and trichloroacetophenones, benzophenone, 4,4'-dimethylamino-benzophenone, thioxanthone derivatives such as thioxanthone, 2-chlorothioxanthone, 2-methylthioxanthone, 2-ethylthioxanthone and the like, fluorenone, dibenzosuberone, 6,11-dihydrodibenzothiepin-11-one, and quinones such as anthraquinone, and anthraquinone sulfonate. Preferred is 2,2-dimethoxyphenyl-2-acetophenone.

The adhesive composition may contain one or more additives such as fillers, pigments, organic coupling agents (for bonding a filler to a polymer), slip agents, flow agents, and the like. Suitable conventional additives are well known to those skilled in the art.

A filler enhances the non-tacky properties of the solid adhesive composition. Moreover, the filler reinforces, and controls shrinkage during cure of the adhesive composition. Fillers are usually inorganic particles, granular in shape, which are not expected to improve strength. Fillers generally reduce shrinkage, lower exotherm, improve machineability and, with proper selection, improve electrical properties and thermal conductivity. Reinforcements which are fibrous, such as glass fiber and mica, increase strength and heat resistance, and reduce shrinkage and thermal expansion. Examples of suitable fillers include inorganic carbonates, oxides, sulfates, sulfides, calcium carbonate, calcium sulfate, barytes, blanc fixe, zinc sulfide, silica, diatomaceous earth, clays, magnesium silicate, wollastonite, alumina hydrate, zinc oxide, titanium dioxide, zirconias, zirconium silicate, talcs, calcium carbonate, silicon carbide and organic fillers such as organic pigments and insoluble polymer powders. Preferred are mica, fumed silica and zirconium silicate.

Pigments may be added to the adhesive composition as fillers and to provide color and/or opacity if desired. Conventional pigments may be employed and are well known to those skilled in the art.

Titanate coupling agents are molecular bridges at the interface between an inorganic filler and an organic polymer matrix. Fillers have a tendency to settle out of the solutions of he adhesive composition. It has been found that the incorporation of titanate coupling agents substantially reduce the settling. It is believed that dispersion of an inorganic in an organic phase, in the presence of titanate coupling agents, is enhanced by the replacement of the water of hydration at the inorganic surface with a monomolecular layer or organic functional titanate causing inorganic/organic phase compatibility at the interface, thereby increasing the degree of displacement of air by the organic phase in the voids of the inorganic phase. Suitable titanate coupling agents are commercially available from Kenrich Petrochemicals, Inc. Bayonne, N.J. and E.I. dupont DeNemours & Co., Inc., Wilmington, Del.

Flow aids (or leveling agents) may be used to improve the flow of solutions of the adhesive composition when coating a base or a carrier sheet. Cellulose derivatives and linear polymers are especially useful, e.g., polyvinyl acetate, silicone oils, and Modaflow ™ (believed to be a buryl acrylate polymer commercially available from Monsanto Company). Other leveling and flow agents include aluminum stearate, calcium stearate, sucrose benzoate, and high molecular weight nonionic surface active agents.

Thixotropic agents are useful in controlling viscosity of adhesive solutions when the adhesive solutions are applied to a base or a carrier sheet. They also help maintain different materials in dispersion and prevent phase separation. Thixotropic agents which may be used are well known to those skilled in the art. Examples of these materials are Bentone (a trademark of NL Industries, Inc., Hightstown, N.J., for an organic base salt of a clay mineral, e.g., montmorillonite) and other silicate materials. Other thixotropic agents are the aluminum, calcium, and zinc salts of fatty acids, such as lauric or stearic acid, e.g., Zinc Soap #26 (trademark of the Witco Chemical Co., Inc.); and fumed silicas such as Cab-o-Sil (a fumed silica having an average particle size greater than 200m²/g) and Santocel (trademarks of the Cabot Corporation and Monsanto Corporation, respectively).

Suitable deaeration agents assist bubble release in roller applications. Good results have been obtained with special mixed polymers of vinyl isobutyl ether and acrylic esters (commercially available as Acronol 4L and 700L, from BASF Wyandotte Corp.) with a maximum level of 0.05% based on resin solids. Modaflow TM also can be used as a deaeration additive in the manner described. Other suitable deaeration agents include a reacted mineral oil (Baylab 3056A TM) or antifoams (commercially available as 730P, 3073-7 and 3295 from Witco Chemical Organics Div., 3230 Brookfield, Houston, Tex, 77045); Byk-S1 TM defoamer and Byk-O TM defoamer (commercially available from Byk-Mallinckrodt); Foam Kill 8D TM and Foam Kill Silicone Antifoam compound TM (commercially available from Crucible Chemical Co., Greenville, S.C.).

Catalysts for electroless metal deposition may be included in the adhesive composition. Such catalysts are used to initiate electroless plating of plated through holes in wire scribed boards. For example, a catalytic filler such as an aluminum silicate clay provided with 1-2% palladium as described in U.S. Pat. No. 3,546,009 may be incorporated in the adhesive composition. Another suitable catalyst for electroless metal deposition which may be incorporated in the adhesive composition is 1% palladium reacted with an 85% solution of diglycidyl ether of bisphenol A in dimethylformamide.

The adhesive coating compositions of the present invention may be applied to substrates well in advance of the actual bonding operation. The composition may be simply activated by heat, radiant or ultrasonic energy when it is desired to perform the bonding operation.

Regarding the means of application, the adhesive compositions of the present invention may be applied to carrier sheets or directly to substrates as solutions in volatile organic solvents by methods common to solvent-based adhesives, i.e., spray coating, doctor-blade coating, roll coating doctor-roll coating and the like. The adhesive coating compositions may be conveniently spray applied to substrates as solutions in volatile organic solvents using conventional spray equipment. The result in any case is a non-tacky, solid, cross-linkable adhesive layer which dries quickly in air and which can be heat activated immediately or thereafter up to the time it is C-staged.

In use, it has been found convenient to coat the film onto a releasable liner such as a polyester film having a release coating, e.g., a silicone release coating. The adhesive coating composition may be peeled away from the releasable liner when desired for a particular application. The adhesive coating compositions of the present invention may be applied to substrates as films having a uniform thickness between about 40 and about 150 micrometers by platen pressing, hot roll lamination and vacuum lamination.

The adhesive coating compositions of this invention have many advantageous properties. They are useful for forming wire scribed circuits, for coating onto or encapsulating wires or as an adhesive layer on a substrate such as a printed wiring board. The property of being non-tacky when in the solid form allows the adhesive coated substrate to be handled during the processing steps of forming a wire scribed circuit board. It also allows the adhesive coated substrate to be wired without fouling the wire positioning mechanism. Further, the non-tacky surface does not attract and hold debris. The heat activatable property of the composition prior to C-staging of the polymeric resin allows a wire which is placed on an activated adhesive coated substrate to adhere rapidly and easily. The C-stageable property of the polymeric resin allows the adhesive composition to be an excellent insulator, and to withstand high temperature service and harsh chemical environments. When used in the manufacture of a wire scribed circuit board, the C-staged adhesive composition keeps overall wire movement during subsequent lamination steps to less than 0.15 mm/m.

The adhesive bond between the wire and the substrate may be measured by vertically peeling the wire in a direction away from and perpendicular to the board surface, or, alternatively, horizontally peeling the wire in a direction along the board surface which is transverse to the cylindrical axis of the wire. An adhesive according to this invention should be capable of bonding a 0.1 mm diameter wire with a peel strength of 30 to 60 grams before curing to a C-stage.

EXAMPLE I

A phenoxy coating composition suitable as an adhesive layer for wire scribed circuit boards was prepared as follows:

| | Weight |
|---|---|
| 1. Phenoxy resin (Phenoxy resin, 32% soids, dissolved in 2-ethoxyethylacetate. The phenoxy resin is a poly[p,p-isopropylidene- diphenoxy-(hydroxyethyl)-ether] having from 23 to 350 monomer units per molecule, and terminal epoxide or phenol groups. The weight average molecular weight, $M_w$, was 300,000, and its number average molecular weight, $M_n$, is 20,000. The phenoxy resin solution is commercially available from Shell Chemical Corp., Houston, TX as Eponol 55-L-32 TM.) | 14.0 kg |
| 2. Blocked aromatic polyisocyanate which will unblock at 125–160° C. (The blocked polyisocyanate is 60% solids dissolved in a 50/50 mixture of xylene and 2-ethoxyethylacetate. The blocked aromatic polyisocyanate solution is commercially available from Mobay Chemical Corp., Plastics Coating Div., Pittsburgh, PA as Desmodur BL 1260A TM.) | 2.95 kg |
| 3. Blocked aliphatic polyisocyanate which will unblock at 100–110° C. (The blocked polyisocyanate is 75% solids dissolved in a 50/50 mixture of xylene and 2-ethoxyethylacetate. The blocked aromatic polyisocyanate solution is commercially available from Mobay Chemical Corp., Plastics Coating Div., Pittsburgh, PA as Desmodur VP KL 5-2371 TM.) | 750 g |
| 4. Phlogopite mica powder, 325 mesh (commercially available as Suzorite TM mica, 325 HK from Marietta Resouces International Ltd., Hunt Valley, MD) | 0.22 kg |
| 5. Zirconium silicate powder, average particle size 0.55 micrometers (commercially available from TAM Ceramics, Inc., Niagara Falls, NY as Excelopax TM.) | 0.22 kg |
| 6. Fumed silica having a surface area of 200 m²/g (commercially available as Cab-O-Sil TM M-5 from Cabot Corp., Tuscola, IL.) | 0.13 kg |
| 7. Organic titanate coupling agent* (commercially available from Kenrich Petrochemicals, Bayonne, NJ as KR-238M TM). The chemical formula of the organic titanate was: | 1.6 kg |

-continued

| | Weight |
|---|---|

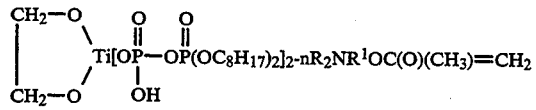

| | |
|---|---|
| 8. Aluminum silicate clay having 16 mg of palladium per gram prepared by the procedures of U.S. Pat. No. 3,546,009 (commercially available from Matthey Johnson Inc., Malvern, PA 19355, as Cat 10 ™ powder). | 0.19 kg |

The above listed ingredients were mixed together in a high shear mixer (Cowles Dispersator TM) for five minutes.

The combined ingredients were milled on a three roll paint mill into a uniform adhesive solution.

The adhesives solution was doctor-roll coated onto a release treated polyethyleneterphthalate film. The adhesive solution layer had a wet film thickness of 0.4 mm. The coated film was passed through a three stage hot air drying oven. The first stage was at 65° C., and the second and third stages were at 77° C. The total time in the oven was 7 minutes. After drying, the Polyethyleneterphthalate film coated with the adhesive layer was wound into a roll. The adhesive layer was a non-tacky dry film containing 22% residual solvent, primarily 2-ethoxy ethylacetate, and having a dry film thickness of 0.1 mm. Although non-tacky, the adhesive layer was not non-blocking, so the polyethyleneterphthalate film had a release coating on both sides.

Then an adhesive layer on polyethyleneterphthalate film was hot roll laminated over an epoxy-glass laminate at a temperature of 70° C. The polyethyleneterphthalate film was removed, and a circuit pattern was scribed into the adhesive surface with 0.1 mm diameter insulated copper wire, the wire having polymide insulation with a minimum thickness of 0.023 mm and an outer coating of polyvinyl butyral with a minimum thickness of 0.01 mm. The wire scribed circuit was baked at 80° C. for one hour to remove residual solvent and then at 160° C. for one hour to unblock the polyisocyanate which formed crosslinks with the phenoxy and C-staged the adhesive layer. After curing the adhesive layer, the adhesion between the scribed wires and the C-staged adhesive substrate was 60 N.

The wire scribed circuit pattern was covered with a layer of prepeg by laminating at 160° C. and 2.4 MPa (350 psi) to protect the wire pattern and provide a rugged interconnection package. After lamination, all the scribed wires were in the predetermined position, and there had been no movement or swimming of the wires during the lamination process. The thus laminated wire scribed circuit board was then encapsulated with a protective plating mask, drilled to form through-holes, plated in order to metallize said through-holes, and the protective plating mask was removed, in accordance with methods well known to one skilled in the art. The Insulation Resistance of the wire scribed circuit board formed in this way was then measured in accordance with the procedures outlined in MIL-STD-202, Methods, 106 and 302. All measurements were made using a Hewlett Packard Model 4329A High Resistance Meter with an applied potential of 100 volts DC. The Insulation Resistance was determined to be in the range of 106 megohms.

For comparison, another epoxy glass laminate with an etched power and ground connection pattern was processed by the conventional wire scribed circuit technique. The adhesive had the following composition:

| | |
|---|---|
| Acrylonitrile-butadiene copolymer rubber | 26.9% |
| Alkyl phenolic resole resin | 13.4% |
| Diglycidyl ether of Bisphenol A, $M_w = 1000$ | 9.0% |
| Chlorosulfonated polyethylene rubber | 9.0% |
| Phenolic novolac resin containing hexamethylenetriamine | 13.4% |
| Zirconium silicate filler | 17.9% |
| Palladium chloride reacted with a liquid epoxy resin | 2.7% |
| Fumed silica | 4.5% |
| Flow agent | 0.5% |
| Copper phthalocyanine pigment | 2.7% |

The adhesive had been coated on both sides of an epoxy prepreg, 0.1 mm thick on one side and 0.05 mm thick on the other. The adhesive was laminated with a hot roll laminator over the epoxy glass laminate and etched copper patterns.

A wire circuit pattern was scribed into the adhesive. After the wire scribed circuit pattern was formed, the adhesive was baked for one hour at 93° C. to cure the adhesive. The bond strength of the wires to the adhesive was 20 N.

A cover layer of prepreg was laminated over the wire scribed pattern at 160° C. an 2.4 MPa (350 psi). After laminating the cover layer, the wire pattern was examined for swimming and shrinkage, and compared to the wire-pattern laminated into the phenoxy based adhesive described above The results of this evaluation are outlined below:

| | Conventional Adhesive | Phenoxy based Adhesive |
|---|---|---|
| Wire Swimming | Slight | None |
| Wire Pattern Shrinkage | 0.67 mm/m | 0.07 mm/m |

After the cover layer prepreg had been laminated to the wire scribed circuit, it was encapsulated with a protective plating mask, drilled to form through-holes, plated so as to metallize said through-holes, and the protective plating mask was removed, all in accordance with methods well known to one skilled in the art. The Insulation Resistance of the thus formed wire scribed circuit board was then measured using the procedure outlined above. This was determined to be in the range of $10^4$ megohms (compared to $10^6$ megohms for the wire scribed circuit board made with phenoxy-based adhesive).

In a separate test, the Volume Resistivities of the conventional adhesive and that of the phenoxy-based adhesive were measured. The results of this test are reported below:

| | Conventional Adhesive | Phenoxy based Adhesive |
|---|---|---|
| Volume resistivity | $10^6$ megohm-cm | $10^8$ megohm-cm |

EXAMPLE II

Example I was repeated and similar results obtained using the following phenoxy coating composition as an adhesive layer for wire scribed circuit boards:

| | Weight |
|---|---|
| 1. Phenoxy resin (same as in Example I) | 18.2 kg |
| 2. Blocked aliphatic polyisocyanate which will unblock at 100-110° C. (same as in Example I) | 2.38 kg |
| 3. Phlogopite mica powder, 325 mesh (same as in Example I) | 0.13 kg |
| 4. Zirconium silicate powder, average particle size 0.55 micrometers (same as in Example I) | 0.13 kg |
| 5. Fumed silica having a surface area of 200 $m_2/g$ (same as in Example I) | 0.053 kg |
| 6. Organic titanate coupling agent (same as in Example I) | 1.6 g |
| 7. Aluminum silicate clay having 16 mg of palladium per gram prepared by the procedures of U.S. Pat. No. 3,546,009 (same as in Example I) | 0.22 kg |

The above listed ingredients were mixed together in a high shear mixer (Cowles Dispersator TM) for five minutes and then an epoxy resin solution was added as follows:

| | Weight (Dry) |
|---|---|
| 8. Polyglycidylether of Bisphenol A with a weight average molecular weight of 44,000, and a number average molecular weight of 11,000 as a 46% solids solution in a mixture of 92.5% 2-hydroxymethoxypropane and 7.5% methyl isoamyl ketone (commercially available as Epi-Rez 560 TM from Celanese Corp.) | 2.22 kg |

EXAMPLES IIIA-IIIE

Example II is repeated five times except that the adhesive compositions are formulated as shown in the Table below. Example IIIA represents a phenoxy resin adhesive formulation similar to that of Example II except that the solvent employed will evaporate more quickly, thereby shortening the drying time. Example IIIB represents an epoxy resin-ultraviolet radiation curable adhesive formulation. Example IIIC represents a B-staging epoxy resin adhesive formulation. Example IIID represents a phenoxy resin adhesive formulation similar to that of Example II except that it cures at a higher temperature (40° C. higher). Example IIIE represents a polyester resin blocked polyisocyanate adhesive formulation.

In the formulation set forth in the above Table for Example IIIC, instead of m-phenylene diamine, there may be used hydrazine or benzoguanimine as the B-staging curing agent for the epoxy resin.

While the invention has been disclosed herein in connection with certain embodiments and certain structural and procedural-details, it is clear that changes, modifications or equivalents can be used by those skilled in the art and accordingly, such changes within the principles of this invention are intended to be included within the scope of the claims hereinbelow.

EXAMPLE IV

A copper wire, having a diameter of 0.1 mm, which had been insulated with a minimum thickness of 0.023 mm of cured aromatic polyimide insulation (available from E.I. dupont de Nemours & Co. as Pyre-M.L. ® Wire Enamel) was overcoated with the adhesive composition of Example I in the following manner:

1. The adhesive composition was diluted with N-Methyl, 2-Pyrrolidone until its viscosity was in the range of 1,000 to 2,000 cps when measured at 20° C.;
2. The insulated wire described above was then immersed in said diluted adhesive composition and passed through a circular die having a diameter of 0.1626 mm such that only a wet film of adhesive measure 0.005 mm in thickness remained on the surface of said wire, any excess adhesive having been removed from the surface by the die;
3. The coated wire was then passed through a horizontal hot air oven which was 1.5 meters in length at a speed of between 21 and 24 meters per minute. During this operation, the oven was maintained at a temperature of 190° C., so that the solvent was evaporated from the adhesive film;
4. The wire was again immersed into the diluted adhesive composition, passed through a die having a slightly larger diameter than that described in step 2 above, and again passed through the hot air oven under the same conditions as described in step 3 above. This sequence was repeated a total of 28 times, each time using a die with a progressively larger diameter until the overall diameter of the thus adhesive overcoated wire was 0.183 mm. This type of coating is well known to one skilled in the art.

EXAMPLE V

The adhesive composition of Example I was prepared, coated onto a release treated polyethyleneterphthalate film, and dryed as in Example I. This adhesive layer was then hot roll laminated at a temperature of 70° C. onto the surface of a substrate which had been prepared in the following manner:

1. A piece of fiberglass reinforced epoxy laminate which was 1.6 mm thick and which had copper foil measuring 0.07 sun in thickness bonded to its surface was subjected to photoimaging and chemically milling procedures well known to one skilled in the art so as to form a ground plane in the copper foil;
2. A piece of B-staged epoxy prepeg was placed over the above formed ground plane and laminated to it at a temperture of 175° C. and a pressure of 2.4 MPa. Following this lamination, the substrate was baked in a hot air circulating oven maintained at 175° C. for a period of 60 minutes in order to fully cure the epoxy resin of the prepeg. The surface of the cured prepeg was then brushed in a conventional brushing machine in order to roughen the surface prior to the application of the adhesive layer.

The thus prepared substrate was permitted to return to room temperature and then the polyethyleneterphthalate film was removed. A circuit pattern was scribed into the exposed adhesive surface with the adhesive overcoated wire which had been prepared in Example IV above. The wire scribed circuit was baked at a temperature of 120° C. for a period of 20 minutes in order to remove residual solvent and to unblock the blocked aliphatic polyisocyanate and cause sufficient curing of the composition to prevent "swimming" wires during any subsequent processing steps.

The scribed circuit was next subjected to a flush press in order to provide a uniform spacing between the scribed wires and the copper ground plane. This was accomplished by subjecting the wire scribed circuit to a pressure of 1.9 MPa at a temperature of 150° C. for a period of 10 minutes. In this way, the cured epoxy prepeg served as a dielectric barrier of uniform thickness separating the scribed wire from the ground plane. This results in a finished circuit which exhibits extremely through-holes and subjected to photoimaging and chemical milling techniques in order to form surface features suitable for the surface mounting of electrical components, in accordance with methods well known to one skilled in the art. The characteristic impedance of the resulting circuit was 62 ohms.

| COMPONENT | IIA | IIB | IIC | IID | IIE |
|---|---|---|---|---|---|
| An epoxy resin having an epoxy equivalent weight of 4,000 (commercially available as EPON 1009 from Shell Chemical Co.) | | | 100 g | | |
| Eponol 55-L-32 TM | | 80 g | | | |
| Phenoxy resin, 30% solids, dissolved in propylene glycol monomethylether and methylethyl ketone. The phenoxy resin is a poly [p, p-isopropylidene-diphenoxy-(hydroxyethyl)-ether] having from 23 to 350 monomer units per molecule and terminal epoxide or phenol groups and has a Mn of 20,000 (commercially available as Eponol 55-8-30 from Shell Chemical Corp.) | 90 g | | | | |
| Polygycidylether of bisphenol A with a MW of 44,000 and a Mn of 11,000 as a 46% solution in a mixture of 92.5% 2-hydroxymethoxy-propane and 7.5% methyl isobutylketone (commercially available as RDX 67447 from Celanese Corp.) | 10 g | | | | |
| Desmodur VP KL 5-2371 TM | 32 g | | 33 g | | 30 g |
| A phenol blocked polyisocyanate adduct based upon toluene diisocyanate. The polyisocyanate is 100% solids (commercially available from Mobay Chemical Corp. as Desmodur AP STABIL TM) | | | | 12 g | |
| m-phenylene diamine, a room temperature curing agent used for B-staging the epoxy resin. | | | 2 g | | |
| Polyester adhesive resin with dihydroxy functionality and average molecular weight of 20,000 prepared from isophthalic and a nine carbon dibasic acid esterified with ethylene glycol and diethylglycol as a 51% solution in butanone (commercially available as Adcote 76 PI TM from Morton Chemical Corp.) | | | | | 100 g |
| Diglycidyl ether of bisphenol A having an epoxy equivalent weight of 190 (commercially available as EPON 828 TM from Shell Chemicals Corp.) | | 20 g | | | |
| Cationic ultraviolet curing agent for the epoxy resin, 50% solids in propylene carbonate (commercially available from General Electric Co., N.Y., N.Y. as UVE 1014 TM) | | 2 g | | | |
| Neopentyl diglycidyl ether, a reactive diluent plasticizer | | 5 g | 10 g | | |
| Methylethyl ketone, a solvent plasticizer | | | Amount Sufficient to make 40% solids solution | | |
| Propylene glycol monomethylether, a solvent plasticizer | Amount Sufficient to permit composition to wet a surface | | | Amount Sufficient to permit composition to wet a surface | |
| A high boiling petroleum oil plasticizer (commercially available from Kenrich Petrochemicals, Bayonne, N.J. as Kenplast G TM) | | | 10 g | | |
| A fumed silica (Cab-O-Sil TM) | 1-2 g | 1-2 g | 1-2 g | 1-2 g | 1-2 g |
| Phlogopite mica powder (Suzorite TM) | 2.5-5 g | 2.5-5 g | 2.5-5 g | 2.5-5 g | 2.5-5 g |
| Zirconium Silicate (Excelopax TM) | 2.5-5 g | 2.5-5 g | 2.5-5 g | 2.5-5 g | 2.5-5 g |
| Aluminium Silicate Clay (Cat 10 TM powder) | 3.7-7 g | 3.7-7 g | 3.7-7 g | 3.7-7 g | 3.7-7 g |
| Organic Titanate Coupling Agent (KR-238M TM) | .03 g | .03 g | .03 g | .03 g | .03 g | consistent characteristic impedance for all wires, an essential characteristic for circuits which are to be used at high frequencies.

The scribed circuit was baked in a hot air circulating oven maintained at 160° C. for a period of 30 minutes in order to unblock the blocked aromatic polyisocyanate, thus, causing full curing and C-staging of the adhesive composition.

The wire scribed circuit pattern was covered with a layer of epoxy prepeg and a piece of 0.0014 inch thick copper foil by laminating at a temperature of 177° C. and a pressure of 1.9 MPa for a period of 40 minutes. Because of the previous flush press step, the resulting surface of the laminated copper foil was particularly smooth and regular. The thus laminated wire scribed circuit was then drilled to form through-holes at predetermined locations, plated in order to metallize said

What is claimed is:

1. A wire scribed circuit board having a volume resistivity between 20° C. and 120° C. of at least $10^8$ megohm-cm and an insulation resistance as measured in accordance with MIL-STD-202 of at least $1 \times 10^6$ megohms, said circuit board comprising at least one C-staged adhesive layer on a substrate and wire conductors scribed into the adhesive layer; said adhesive layer being formed from a film forming polymeric resin having a number average molecular weight greater than about 10,000 and a hydroxyl, epoxide or unsaturated functionality greater than about 7, said polymeric resin being selected from the group of polyols consisting of polyesters, polyurethanes, phenoxies, epoxies and mixtures thereof.

* * * * *